(12) United States Patent
Bonning

(10) Patent No.: US 12,145,324 B2
(45) Date of Patent: Nov. 19, 2024

(54) FILM-CLOSURE APPARATUS FOR PLASTIC FILM MATERIAL, PRINTED CIRCUIT BOARD, AND METHOD OF ENHANCING THE OPERATION OF A FILM-CLOSURE APPARATUS

(71) Applicant: Green Light Packaging Limited, Cardiff (GB)

(72) Inventor: Mark Bonning, Bristol (GB)

(73) Assignee: Green Light Packaging Limited (GB)

( * ) Notice: Subject to any disclaimer, the term of this patent is extended or adjusted under 35 U.S.C. 154(b) by 594 days.

(21) Appl. No.: 17/438,584

(22) PCT Filed: Feb. 7, 2020

(86) PCT No.: PCT/GB2020/050283
§ 371 (c)(1),
(2) Date: Sep. 13, 2021

(87) PCT Pub. No.: WO2020/183123
PCT Pub. Date: Sep. 17, 2020

(65) Prior Publication Data
US 2022/0134678 A1 May 5, 2022

(30) Foreign Application Priority Data
Mar. 13, 2019 (GB) .................................... 1903440

(51) Int. Cl.
*B29C 65/22* (2006.01)
*B29C 65/00* (2006.01)
(Continued)

(52) U.S. Cl.
CPC ............ *B29C 65/225* (2013.01); *B29C 65/18* (2013.01); *B29C 65/228* (2013.01);
(Continued)

(58) Field of Classification Search
CPC ..... B29C 65/225; B29C 65/18; B29C 65/228; B29C 65/7894; B29C 66/43;
(Continued)

(56) References Cited

U.S. PATENT DOCUMENTS 3,934,119 A * 1/1976 Trenkler .................. H05B 3/00
252/511
7,089,714 B2 * 8/2006 Thomas ............... B31D 5/0073
53/551
(Continued)

FOREIGN PATENT DOCUMENTS

EP 0 103 977 A1 3/1984
EP 0 571 978 A1 1/1993
(Continued)

OTHER PUBLICATIONS

Vishay Intertechnology, Inc. "PTC Thermistor for Heating Applications". Product Sheet. Noted as being available and accessible on their website since Sep. 20, 2012 at <https://www.vishay.com/en/how/onlineliterature/online-libraries/?category=135> (Year: 2012).*
(Continued)

*Primary Examiner* — Alex B Efta
*Assistant Examiner* — Alexander S Wright
(74) *Attorney, Agent, or Firm* — James A. Sheridan; Sheridan Law, LLC

(57) ABSTRACT

A film-closure apparatus is provided which is suitable for closing plastic film material using heat. The apparatus comprises a guide path along which at least part of a plastics film material can pass; a drive means for moving the film material along the guide path; and a printed circuit board comprising a circuit substrate having first and second major board surfaces and a perimeter edge surface, and an electrically conductive heating element which is provided on the circuit substrate along at least part of the perimeter edge
(Continued)

surface. The electrically conductive heating element is positionable on the guide path to apply heat to the film material thereon.

16 Claims, 6 Drawing Sheets

(51) Int. Cl.
| | |
|---|---|
| *B29C 65/18* | (2006.01) |
| *B29C 65/78* | (2006.01) |
| *B65B 51/10* | (2006.01) |
| *H05B 3/06* | (2006.01) |
| *H05B 3/26* | (2006.01) |
| *H05K 1/02* | (2006.01) |
| *H05K 1/03* | (2006.01) |

(52) U.S. Cl.
CPC .......... *B29C 65/7894* (2013.01); *B29C 66/43* (2013.01); *B29C 66/73921* (2013.01); *B29C 66/849* (2013.01); *B29C 66/91313* (2013.01); *B29C 66/91315* (2013.01); *B29C 66/91423* (2013.01); *B65B 51/10* (2013.01); *H05B 3/06* (2013.01); *H05B 3/267* (2013.01); *H05K 1/0212* (2013.01); *H05K 1/0346* (2013.01); *H05K 2201/0154* (2013.01)

(58) Field of Classification Search
CPC ............ B29C 66/73921; B29C 66/849; B29C 66/91313; B29C 66/91315; B29C 66/91423; B29C 66/876; B29C 66/83413; B29C 66/91213; B29C 66/91651; B29C 66/1122; B29C 66/133; B29C 66/4322; B65B 51/10; H05B 3/06; H05B 3/267; H05B 3/3442; H05B 3/403; H05B 3/3405; H05B 3/0057; H05B 3/16; H05B 3/265; H05K 1/0212; H05K 1/034; H05K 1/167; H05K 1/117; H05K 2201/0154; H05K 2201/09263; H05K 2201/10446; Y10S 165/37

See application file for complete search history.

(56) References Cited

U.S. PATENT DOCUMENTS

| | | | |
|---|---|---|---|
| 2012/0085750 | A1 | 4/2012 | Hauer |
| 2017/0282479 | A1* | 10/2017 | Wetsch ................ B31D 5/0073 |

FOREIGN PATENT DOCUMENTS

| | | |
|---|---|---|
| GB | 2 387423 A | 10/2003 |
| WO | 92/14600 A1 | 9/1992 |
| WO | 2018/203079 A1 | 11/2018 |

OTHER PUBLICATIONS

Search Report for GB1903440.4 dated Jul. 30, 2019, 2 pp.
International Search Report for PCT/GB2020/050283 dated Apr. 23, 2020, 8 pp.

* cited by examiner

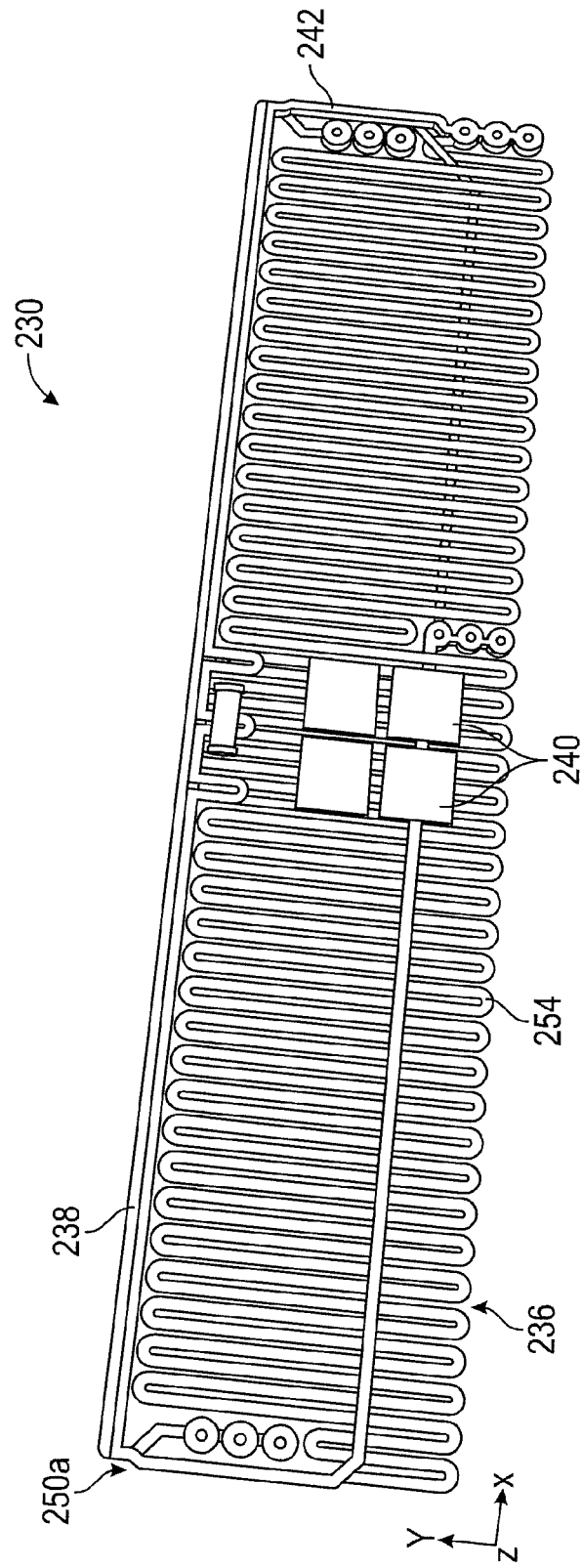

FILM-CLOSURE APPARATUS FOR PLASTIC FILM MATERIAL, PRINTED CIRCUIT BOARD, AND METHOD OF ENHANCING THE OPERATION OF A FILM-CLOSURE APPARATUS

The present invention relates to a film-closure apparatus for closing plastic film material using heat, particularly but not necessarily exclusively suited to the sealing of plastic packaging material. The invention further relates to a printed circuit board suitable for use as a heating element of the film-closure apparatus, and to a method of improving the operation of a film-closure apparatus.

Traditionally, sealing apparatuses for thin-film plastic packaging, such as plastic bags, utilise a hot wire as the method of sealing. Electricity is passed through a short metal wire causing it to heat and melt the plastic material of the packaging. Solidification of the plastic material can then result in sealing of adjacent components.

The wires utilised can be unreliable, since they expand and contract during the heating cycle, which can cause the wire to fracture. Mounting of the wire in a suitable sealing configuration can also be challenging, given the need to accommodate the expansion. A narrow wire is also difficult to clamp effectively into a larger machine.

The present invention seeks to provide an improved heating element configuration for a film-closure apparatus which overcomes the above-referenced issues.

According to a first aspect of the invention, there is provided a film-closure apparatus for closing plastic film material using heat, the film-closure apparatus comprising: a guide path along which an edge of a plastics film material can pass; drive motor or similar means for moving the film material along the guide path; and a printed circuit board comprising a circuit substrate having first and second major board surfaces and a perimeter edge surface, and an electrically conductive heating element which is provided on the circuit substrate along at least part of the perimeter edge surface; and the electrically conductive heating element being positionable on the guide path to apply heat to the film material thereon.

The edge of a printed circuit board provides an elongate and flat surface which is suitable for mounting a heating element. This has significant advantages over the prior art. Firstly, the heating process is much more energy efficient that for configurations in which large amounts of metal are required, such as for plate-like heating elements. Furthermore, the printed circuit board arrangement is much more resistant to damage than a brittle heating wire. There is also the additional advantage of a printed circuit board having a simple rectilinear configuration, allowing for simple plugging engagement of the printed circuit board with connection terminals. Replacement of worn or damaged heating elements is therefore much simplified compared with the arrangements known in the art.

Preferably, the electrically conductive heating element may comprise a plurality of spaced-apart exposed conductors which extend along the perimeter edge surface in parallel to one another. Optionally, four said exposed conductors may be provided.

Having a plurality of spaced apart exposed conductors provides a good heating profile which will create suitable bonding characteristics for a plastics film material, whilst also reducing the amount of metal which must be heated. This further improves the energy efficiency of the apparatus. The conductors are spread over the layers of the circuit substrate providing a grated exposed surface area for the heat to emit therefrom. This results in a wider and more uniform seal than a single track would provide.

The perimeter edge surface may comprise four linear edge surface sections, the electrically conductive heating element being provided along one linear edge surface section.

Linear edge surface sections are advantageous since they will not provide awkward corners or snagging points on the guide path which could otherwise damage the plastics film material as it is driven through the apparatus.

Optionally, the electrically conductive heating element may extend along all or substantially all of the length of the said one linear edge surface section. Preferably, the said one linear edge surface section may be a longitudinal edge surface section.

An elongate heating surface provides improved sealing characteristics than, for example, a short and wide heating surface, since the elongate heating surface will be able to be aligned along the longitudinal axis of the guide path most effectively.

The electrically conductive heating element may protrude from the perimeter edge surface.

A projecting heating element has the advantage of spacing the heating contact surface of the printed circuit board away from the circuit substrate itself, reducing the risk of contact between the plastics film material and the circuit substrate during operation of the apparatus.

Preferably, the circuit substrate may be formed from polyimide.

Instead of using the more common FR4 circuit substrate material, it is preferred that the more thermally resistant polyimide be used, to prevent thermal damage to the printed circuit board as the electrically conductive heating track increases in temperature during use.

Optionally, the printed circuit board may comprise a thermistor in electrical communication with the electrically conductive heating element.

The advantage of a circuit substrate is that it provides a suitable mounting point for a thermistor or similar temperature control element. This allows the printed circuit board to be installed as a standalone unit, which may help to simplify the assembly process for the film-closure apparatus.

The heating element may extend out of an outer casing of a heating unit at or adjacent to the guide path. Two said heating units may preferably be provided, the guide path extending through a channel formed between the heating units.

Mounting of the printed circuit board as part of a heating unit which is attachable to a main body of the apparatus provides a simple means of allowing the printed circuit board to contact the guide path and therefore provide a heating effect. There may be several advantageous mounting configurations.

In one optional embodiment, the circuit substrate may include at least one mounting aperture for mountably supporting the printed circuit board to the heating unit.

Fasteners which engage with the printed circuit board through one or more apertures provide a simple means of providing both secure and releasable engagement of the printed circuit board with respect to the guide path.

In an alternative embodiment, the heating unit may comprise a PCB holder into which the printed circuit board is receivably engagable.

A pluggable holder, which allows for the printed circuit board to be slotted into position, has the advantage of ensuring that the electrical connection between the electrically conductive heating element and corresponding terminals to be made automatically as part of the mounting process. This plug-and-play arrangement allows for simple replacement of the printed circuit board in the event of damage or wear thereto.

Optionally, the PCB holder may comprise sprung terminals for forming an electrical connection with the electrically conductive heating element.

Sprung terminals which accept the printed circuit board are a simple means of ensuring that the printed circuit board is held firmly in position whilst also making a secure electrical connection.

Preferably, the electrically conductive heating element may be formed from copper.

Copper is the most commonly-used electrically conductive element used on printed circuit boards, and therefore utilisation of this metal for the electrically conductive heating element will likely simplify manufacture of the printed circuit board.

The electrically conductive heating element may be in electrical communication with an extended resistance track of the circuit substrate.

An extended resistance track allows the resistance of the entire trace to be predetermined based on specific situational requirements of the apparatus, since the resistance used will result in a specific operating temperature for a given supply voltage and/or current.

In one configuration, the resistance track may be embedded within the circuit substrate.

Embedding of the resistance track may protect the conductive material from damage, improving the robustness of the printed circuit board. This may be significant where rapid replacement of parts is expected.

A length of the resistance track may be provided in accordance with a desired resistance.

The length of the resistance track will play a large part in determining the final resistance and therefore heating temperature of the printed circuit board, and therefore selection of the length may be significant.

According to a second aspect of the invention, there is provided a printed circuit board for a film-closure apparatus, the printed circuit board comprising: a circuit substrate having first and second major board surfaces and a perimeter edge surface; and an electrically conductive heating element which is provided on the circuit substrate along at least part of the perimeter edge surface.

The printed circuit board may be provided as a standalone retrofittable element which can be installed into existing film-closure apparatuses, to both enhance their robustness and also improve their energy efficiency.

According to a third aspect of the invention, there is provided a method of enhancing the operation of a film-closure apparatus, the method comprising the steps of: a] determining a voltage or current of an existing power supply of the film-closure apparatus and a required sealing temperature; b] providing a printed circuit board in accordance with the second aspect of the invention in which a resistance of the electrically conductive heating element is selected based on the determined voltage or current and sealing temperature; c] removing an existing heating element of the film-closure apparatus; and d] installing the printed circuit board into the film-closure apparatus in communication with the existing power supply, such that electrically conductive heating element outputs the required sealing temperature.

Preferably, during step b], the resistance of the electrically conductive heating element may be selected by altering a track width and/or length.

The ability to selectively tune the temperature of the heating element without needing to alter the input voltage or current is a significant advantage for the present invention. This obviates the need to switch heating wires to alter the temperature, which is a fiddly procedure.

In accordance with a fourth aspect of the invention, there is provided a set of printed circuit boards in accordance with the second aspect of the invention, wherein each of the set of printed circuit boards includes an extended resistance track of different resistance, each printed circuit board having a different heating temperature achievable by its heating element for a given voltage and/or current of a power supply of a film-closure apparatus.

A set or pack of printed circuit boards may advantageously allow for prompt switchover of the printed circuit board where different sealing temperatures are required. This also does not alter the profile of the heating element itself, which may not be the case where, for instance different thicknesses of heating wire might be used to alter the temperature achieved.

The invention will now be more particularly described, by way of example only, with reference to the accompanying drawings, in which:

FIG. 6 shows a perspective representation of another alternative embodiment of a printed circuit board of a film-closure apparatus in accordance with the first aspect of the invention.

Figure 1:
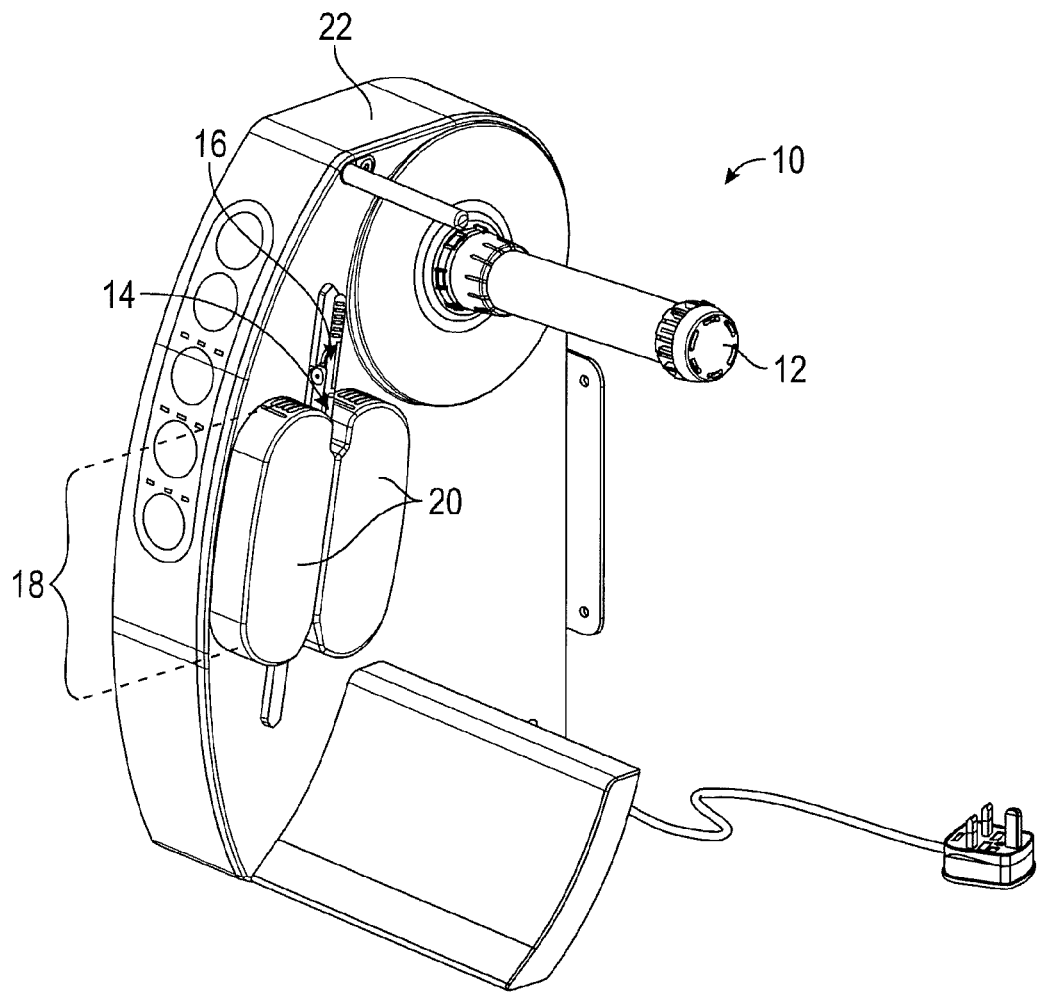
FIG. 1 shows a front perspective representation of a film closure apparatus in accordance with the first aspect of the invention.

Referring to FIG. 1, there is illustrated a film-closure apparatus, indicated at 10, which is suited for the closure of in particular plastics film material. A reel of part-sealed or unsealed plastics film material may be mounted on the spool 12 of the film closure apparatus 10, which can then be drawn along a guide path 14 along which the plastics film material can be sealed.

The plastics film material can be drawn along the guide path 14 by the use of a drive means, such as a motor, which may be integral or separate of the film-closure apparatus 10. Other suitable conveyors could be considered, however. An inflation means, such as an air blower 16, may also be provided on the guide path 14 to inflate the plastic film material into void-fill packaging, which is the usual use of the present film-closure apparatus 10.

A heat-sealing assembly 18 is provided on the guide path 14, preferably having first and second spaced apart heating units 20 either side of the guide path. Each heating unit 20 has an outer case which protects the inner components of the heat-sealing assembly 18.

Figure 2:
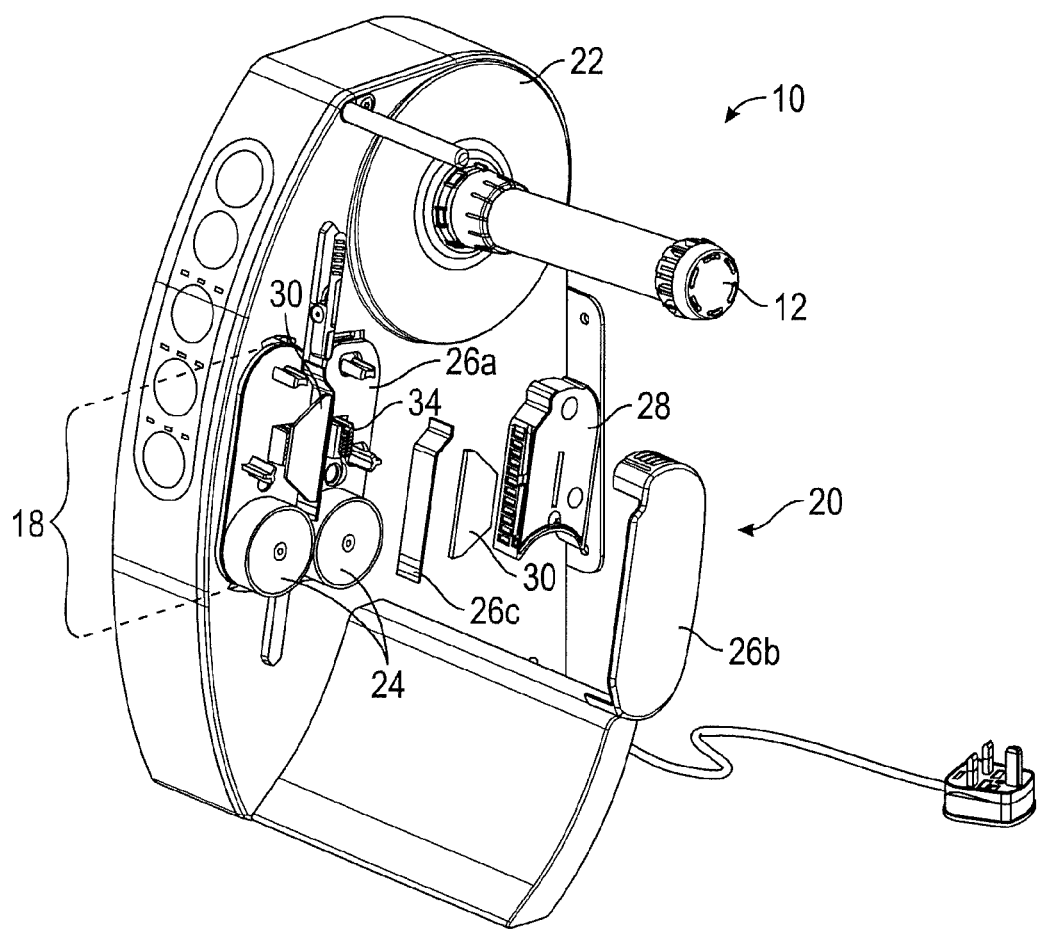
FIG. 2 shows an exploded front perspective representation of the film closure apparatus of FIG. 1, showing the position of the printed circuit board.

FIG. 2 provides a more detailed view of the heat-sealing assembly 18, having been detached from the main body 22 of the film-closure apparatus 10. This detachment shows the position of the drive wheels 24 of the drive means of the present arrangement. Each outer case preferably has first, second and third case portions 26*a*, 26*b*, 26*c* which enclose a PCB holder 28 of each heating unit 20. In this case, the exploded view shows the first heating unit 20.

The PCB holder 28 is shaped to accommodate its respective drive wheel 24, whilst also providing a suitable mount for a printed circuit board 30 which provides the heating for the heat-sealing assembly 18.

Figure 3:
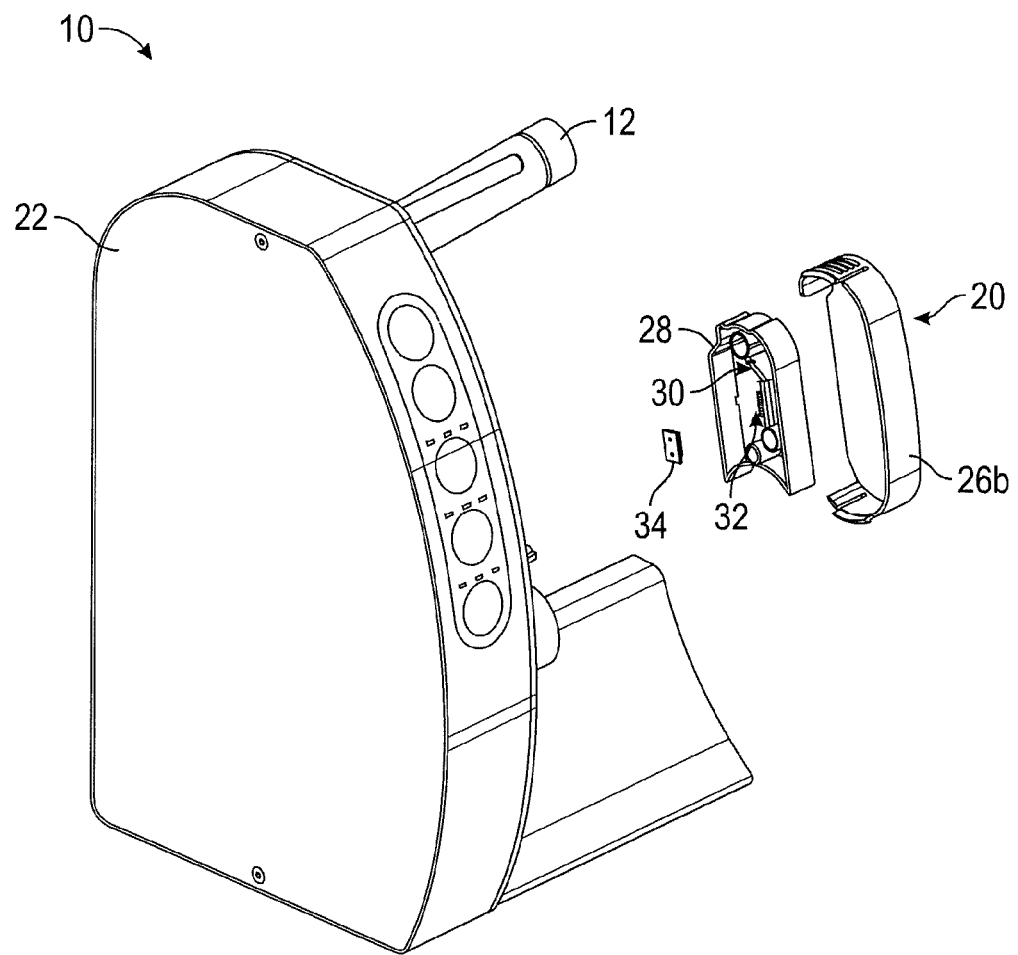
FIG. 3 shows an exploded rear perspective representation of the film closure apparatus of FIG. 1, showing the position of the printed circuit board.

The printed circuit board 30 is provided so as to have a pluggable contact element 32 formed on or attachable to the printed circuit board 30, and which is engagable with a, preferably sprung, corresponding terminal plug 34 which is positioned on or in the first case portion 26*a*, at or adjacent to the main body 22 of the film-closure apparatus 10. The terminal plug 34 can be seen in more detail in FIG. 3 in respect of the second heating unit 20.

The printed circuit boards 30 are here provided as trapezoidal elements which readily fit within the outer case of their respective heating units 20, though other shapes or forms may be considered as required. An alternative configuration is discussed below.

The printed circuit boards 30 are mounted such that an edge of the circuit substrate is positioned on or adjacent to the guide path 14. A heating element is positioned on the edge of the circuit substrate to apply heat to plastics film material passing therealong. The specific construction of an exemplary printed circuit board will now be outlined in detail.

Figure 4:
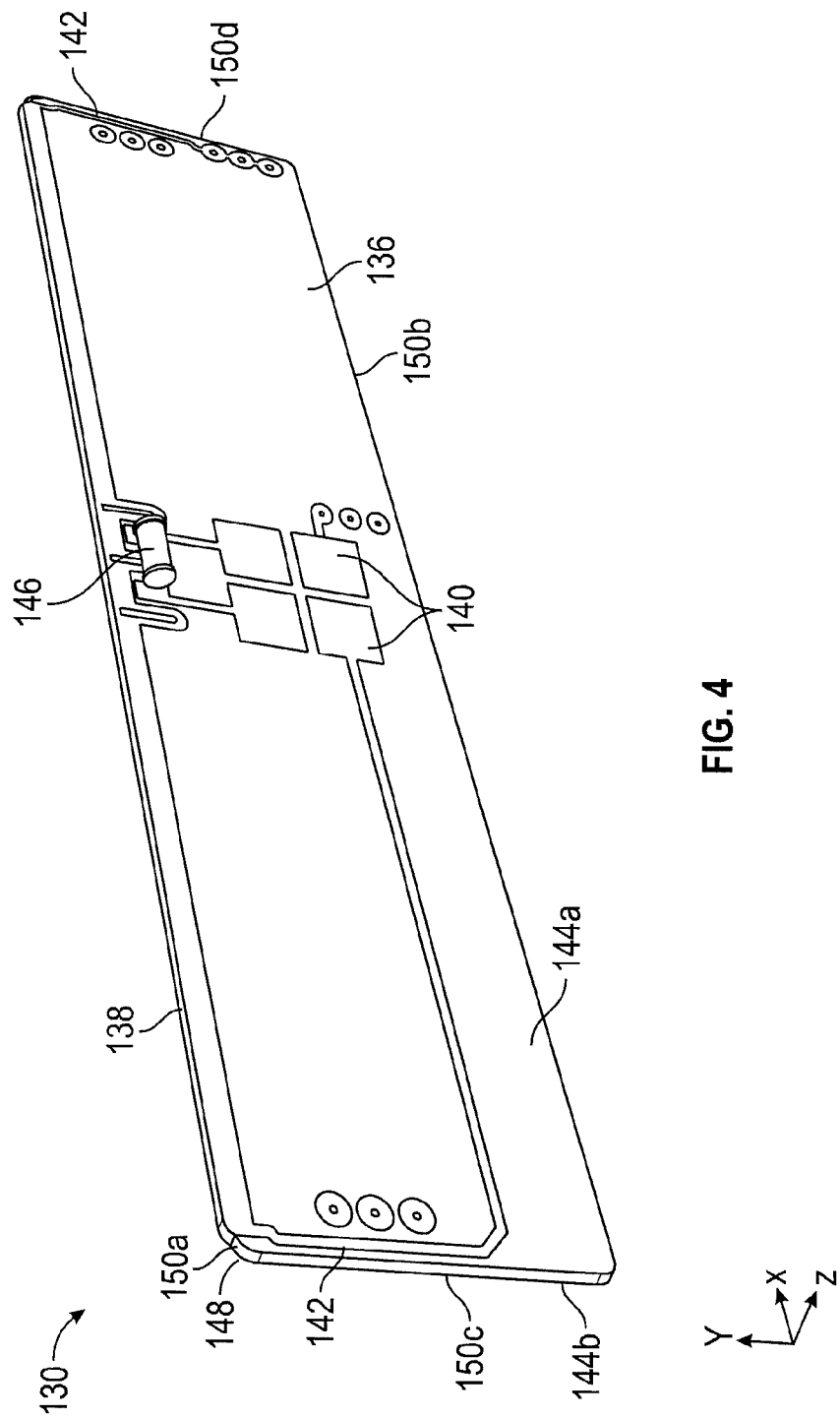
FIG. 4 shows an alternative embodiment of a printed circuit board of a film-closure apparatus in accordance with the first aspect of the invention.

Referring to FIG. 4, there is illustrated a printed circuit board, indicated at 130, which is suitable for use in conjunction with, for example the film-closure apparatus 10 as previously described or a similar heat-sealing apparatus for closing plastics film material.

The printed circuit board 130 comprises a circuit substrate 136, typically polyimide rather than FR4 for the improved thermal characteristics, having an electrical trace thereon. The electrical trace comprises an electrically conductive heating element 138, a plurality of connection pads or terminals 140, and interconnecting conductive material 142 therebetween which completes the circuit on the circuit substrate 136.

The circuit substrate 136 is here formed as a rectilinear substrate, having first and second major surfaces 144*a*, 144*b*, which represents the usual component mounting surfaces of the printed circuit board 130. Alternative geometries could of course be considered, however, such as the trapezoidal arrangement shown in FIGS. 2 and 3. As illustrated, components can be mounted thereto, such as a thermistor 146 for temperature control.

Circuit substrate 136 thicknesses can vary. Common options are 0.2 mm, 0.4 mm, 0.5 mm, 0.6 mm, 0.8 mm, 1.0 mm, 1.2 mm, 1.5 mm, 1.6 mm, 2.0 mm, 2.3 mm, and 3.175 mm.

The thickness of the circuit substrate 136 results in a perimeter edge 148 around the circuit substrate 136 which is between the first and second major surfaces 144*a*, 144*b*. The perimeter edge 148 of a printed circuit board 130 is not typically used for mounting components thereon.

In a rectilinear or substantially rectilinear circuit substrate 136, there will be four linear edge portions 150*a*, 150*b*, 150*c*, 150*d*. Here, the circuit substrate 136 is elongate, and there are therefore two longitudinal edge portions 150*a*, 150*b* and two lateral edge portions 150*c*, 150*d*.

The electrical trace is formed from an electrically conductive material, preferably copper, though other conductive materials could be used. For instance, nickel, or coated nickel could be considered, as could non-metal traces, such as graphene. The majority of the electrical trace is formed on the first and second major surfaces 144*a*, 144*b*.

The electrically conductive heating element 138 is formed on the perimeter edge 148 of the circuit substrate 136. This could be formed as a conductive coating on the perimeter edge 148, but is preferably formed as a protruding or projecting portion away from the circuit substrate 136, and is preferably positioned along all or substantially all of one of the linear edge portions. In this instance, the electrically conductive heating element 138 is formed on one of the longitudinal edge portions 150*a*.

Figure 5:
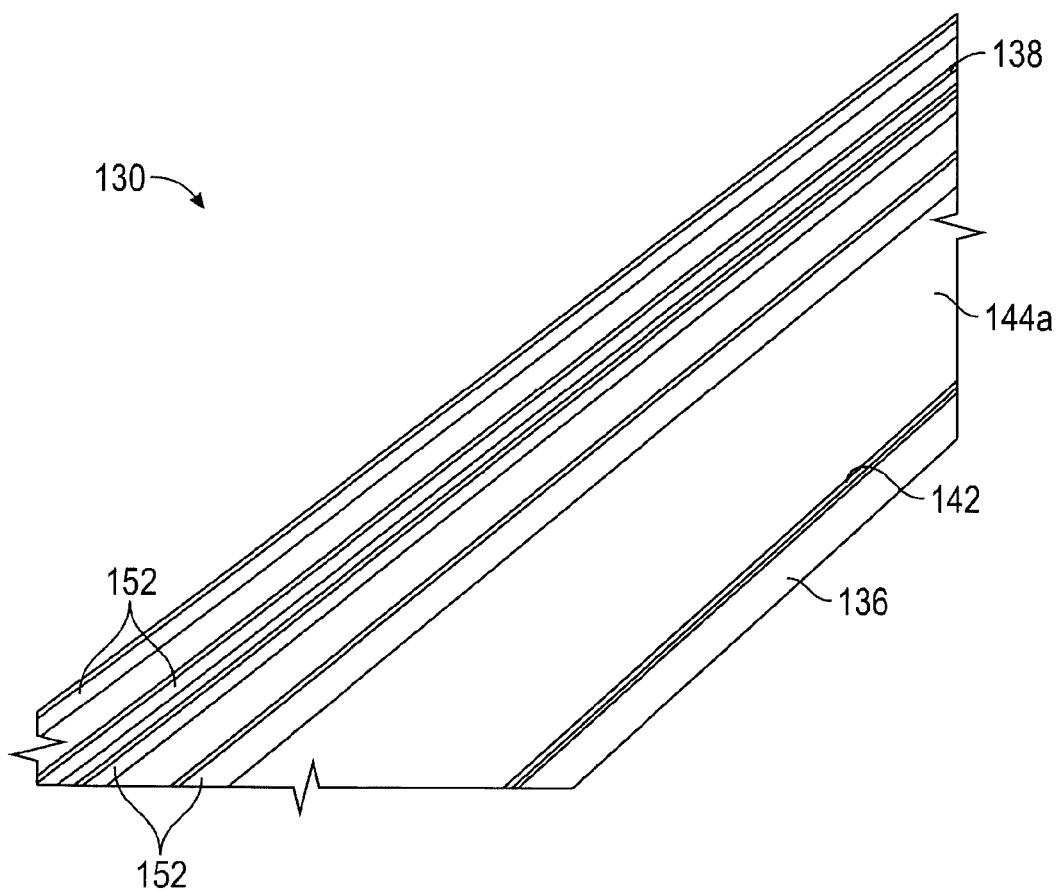
FIG. 5 shows an enlarged perspective representation of the electrically conductive heating track of the printed circuit board of FIG. 4.

FIG. 5 shows the electrically conductive heating element 138 in more detail. The electrically conductive heating element 138 is not necessarily formed as a single contiguous element on the edge portion 150*a*, but instead may be formed as a plurality of exposed conductors 152 here formed in elongate strips. Four such exposed conductors 152 are indicated, extending in parallel along the linear edge portion 150*a*, but the number of exposed conductors 152 may be determined by the thickness of the circuit substrate 136 and/or the thickness of the copper on the printed circuit board 130 surface. The exposed conductors 152 may correspond, for example, with layers of the circuit substrate 136, increasing the exposed surface area available for heating via the heating element 138.

The exposed conductors 152 may have different widths. Here, each of the outermost exposed conductors 152, that is, those closest to the first and second major surfaces 144*a*, 144*b* respectively, may be wider than those inside, and this may provide better sealing characteristics for the plastics film material.

In use, plastics film material is drawn along the guide path 14 of the film-closure apparatus 10 by its drive means, such as the drive wheels 24. As the material passes between the channel defined between the two heating units 20, along which the guide path 14 flows, it will contact or be in close proximity with the heating elements 138 of the printed circuit boards 130 of each heating unit 20. This will heat the plastics film material such that a seal or bond is formed, closing the edge to which heat is applied.

Significantly, it may be possible to retrofit such printed circuit boards 130 to existing film-closure apparatuses 10 in order to enhance their operation. The use of printed circuit boards 130 is an improvement over traditional wires, since they are much less prone to breakage. Additionally, the printed circuit boards 130 use far less energy to bring to temperature than a bulky solid metal heating element.

It is noted that the temperature of the heating element 138 of the printed circuit board 130 will be determined by a voltage or current of an existing power supply of the film-closure apparatus 10, and by the total resistance of the circuit of the printed circuit board 130.

It may therefore be possible to select the temperature of the heating element 138 by altering the resistance of the printed circuit board 130 to match that which is required to perform the sealing.

An embodiment of a printed circuit board 230 which is suitable for this purpose is indicated in FIG. 6. Identical or similar features to the previously described circuit boards will be referred to using identical or similar reference numerals, and further detailed description will be omitted for brevity.

The heating element or track 238 is positioned on one of the longitudinal edges 250*a* of the circuit substrate 236, as previously described, and is in electrical communication with the plurality of connection pads or terminals 240, and interconnecting conductive material 242 therebetween which completes the circuit on the circuit substrate 236.

This electrically conductive trace will have a specific resistance which will affect the temperature of the heating element 238. However, the resistance can be increased by providing an extended resistance track 254, which is here illustrated as an extended trace positioned internally to the circuit substrate 236. It will be appreciated, however, that an extended resistance track 254 may additionally or alternatively be provided along the surface of the circuit substrate 236 in accordance with an appropriate design.

By providing the extended resistance track 254 of a desired length, the user can selectively choose the heating temperature of the heating element 238 based on the heating requirements of the plastics film material chosen. This allows for the possibility of a plurality of different printed circuit boards being provided, each of which being engagable with the film-closure apparatus. The user is therefore able to select a heating temperature by swapping the printed circuit board 230 being used, preferably in a plug-and-play manner.

In the embodiment shown, the printed circuit board 230 may have input parameters of a desired temperature rise of 150° C., a current of 5 A, a voltage of 12V, and a circuit substrate 236 thickness of 1 oz/ft square. The output parameters, that is, requirements of the printed circuit board 230 to achieve the desired temperature rise based on the input parameters, are a trace width of 0.535 mm, a trace length of 1670 mm, and a resistance of 2.41Ω.

Whilst a pluggable engagement mechanism is preferred, it will be appreciated that alternative mounting methods for printed circuit boards to their respective PCB holders may be considered. For example, each printed circuit board may include a mounting aperture via which a more traditional fastener attachment mechanism may be engaged.

It is therefore possible to provide an enhanced heating element arrangement for a film-closure apparatus, which not only improves the robustness of the heating element, but also reduces the energy consumed by the heating process. This is achieved by the provision of a heating element along a perimeter edge of the printed circuit board, which then heats and seals plastics film material passed therealong. This arrangement is versatile, and can conceivably be retrofitted to existing apparatuses, as well as providing a simplified means of selecting the sealing temperature available.

The words 'comprises/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of examples only, and various other modifications will be apparent to persons skilled in the field without departing from the scope of the invention as defined herein.

The invention claimed is:

1. A film-closure apparatus for closing plastic film material using heat, the film-closure apparatus comprising:
   a guide path along which at least part of a plastics film material can pass;
   a driving mechanism for moving the film material along the guide path; and
   a printed circuit board comprising a circuit substrate having first and second major board surfaces and a perimeter edge surface, and an electrically conductive heating element which is provided on the circuit substrate along at least part of the perimeter edge surface;
   the electrically conductive heating element being positionable on the guide path to apply heat to the film material thereon; and
   the perimeter edge surface comprising four linear edge surface sections, the electrically conductive heating element being provided along one linear edge surface section.

2. The film-closure apparatus as claimed in claim 1, wherein the electrically conductive heating element comprises a plurality of spaced-apart exposed conductors which extend along the perimeter edge surface in parallel to one another.

3. The film-closure apparatus as claimed in claim 2, wherein four of said exposed conductors are provided.

4. The film-closure apparatus as claimed in claim 1, wherein the electrically conductive heating element extends along all or substantially all of the length of the said one linear edge surface section.

5. The film-closure apparatus as claimed in claim 1, wherein the said one linear edge surface section is a longitudinal edge surface section.

6. The film-closure apparatus as claimed in claim 1, wherein the electrically conductive heating element protrudes from the perimeter edge surface.

7. The film-closure apparatus as claimed in claim 1, wherein the circuit substrate is formed from polyimide.

8. The film-closure apparatus as claimed in claim 1, wherein the printed circuit board comprises a thermistor in electrical communication with the electrically conductive heating element.

9. The film-closure apparatus as claimed in claim 1, wherein the heating element extends out of an outer casing of a heating unit at or adjacent to the guide path.

10. The film-closure apparatus as claimed in claim 9, wherein two said heating units are provided, the guide path extending through a channel formed between the heating units.

11. The film-closure apparatus as claimed in claim 9, wherein the circuit substrate includes at least one mounting aperture for mountably supporting the printed circuit board to the heating unit.

12. The film-closure apparatus as claimed in claim 9, wherein the heating unit comprises a PCB holder into which the printed circuit board is receivably engagable.

13. The film-closure apparatus as claimed in claim 12, wherein the PCB holder comprises sprung terminals for forming an electrical connection with the electrically conductive heating element.

14. The film-closure apparatus as claimed in claim 1, wherein the electrically conductive heating element is in electrical communication with an extended resistance track of the circuit substrate.

15. The film-closure apparatus as claimed in claim 14, wherein the resistance track is embedded within the circuit substrate.

16. The film-closure apparatus as claimed in claim 14, wherein a length of the resistance track is provided in accordance with a desired resistance.

* * * * *